United States Patent [19]
Thaler et al.

[11] Patent Number: 5,842,106
[45] Date of Patent: Nov. 24, 1998

[54] METHOD OF PRODUCING MICRO-ELECTRICAL CONDUITS

[75] Inventors: Barry Jay Thaler, Lawrenceville; Robert Leon Quinn, Trenton; Paul Leonard Braun, Highland Park; Peter J. Zanzucchi, Lawrenceville; Charlotte A. Burton, Brick; Sterling E. McBride, Lawrenceville; Robert R. Demers, Cranbury, all of N.J.

[73] Assignee: Sarnoff Corporation, Princeton, N.J.

[21] Appl. No.: 554,887

[22] Filed: Nov. 9, 1995

Related U.S. Application Data

[63] Continuation-in-part of Ser. No. 469,238, Jun. 6, 1995, Pat. No. 5,632,876, and Ser. No. 483,331, Jun. 7, 1995, Pat. No. 5,603,351.

[51] Int. Cl.$^6$ .................................. B22F 3/10; B22F 7/04
[52] U.S. Cl. .................................... 419/8; 419/10
[58] Field of Search ............................ 419/5, 8, 10

[56] References Cited

U.S. PATENT DOCUMENTS

| | | |
|---|---|---|
| 5,035,939 | 7/1991 | Colon et al. . |
| 5,337,475 | 8/1994 | Auode et al. .............................. 29/852 |
| 5,366,760 | 11/1994 | Fujii et al. ................................ 427/96 |

OTHER PUBLICATIONS

Bart et al., "Microfabricated Electrohydrodynamic Pumps," *Sensors and Actuators*, A21–A23: 193–197, 1990.

Richter et al., "A Micromachined Electrohydrodynamic Pump," *Sensors and Acuators*, A29:159 168, 1993.

Dasgupta et al., "Electroosmosis: A Reliable Fluid Propulsion System for Flow Injection Analysis," *Anal. Chem.*, 66:1792–1798, 1994.

International Search Report for PCT/US95/14587 dated: Feb. 28, 1996.

*Primary Examiner*—Daniel J. Jenkins
*Attorney, Agent, or Firm*—William J. Burke

[57] ABSTRACT

The present invention provides a method of forming a fluidtight electrical conduit through a high aspect ratio hole, the method comprising sintering a via ink to form the electrical conduit and to seal the hole.

22 Claims, 4 Drawing Sheets

METHOD OF PRODUCING MICRO-ELECTRICAL CONDUITS

This application is a continuation-in-part of U.S. application Ser. No. 08/469,238, titled "Apparatus and Methods for Controlling Fluid Flow in Microchannels," filed Jun. 6, 1995 now U.S. Pat. No. 5,632,867 and a continuation-in-part of U.S. application Ser. No. 08/483,331, titled "Method and System for Inhibiting Cross-Contamination in Fluids of Combinatorial Chemistry Device," filed Jun. 7, 1995 now U.S. Pat. No. 5,603,351.

This application relates to a method of synthesizing electrodes that protrude through high aspect ratio holes in a substrate and seal the hole against fluid leakage.

The invention arose from efforts to construct, on wafer-sized plates (such as glass plates or semiconductor plates) complex microstructures for directing liquids from a number of reservoirs to a large number of reaction cells (e.g., 100 to 10,000 reaction cells). These microstructures can be termed "liquid distribution systems." Integral to these efforts were efforts to construct electrode-based pumps that effect electrokinetic pumping of various liquids. However, to feasibly construct liquid distribution systems, a method was needed to fabricate thousands of protruding electrodes on a wafer-sized plate of substrate. Further, the electrodes needed to protrude through the substrate in a fluid-sealed manner.

Electrical conduits have been constructed through thin plates (e.g., 50 to 200 micron) of substrate by filling holes in the substrate with thick film via inks, i.e., inks that solidify after a firing process into conductive solid. However, in the context of constructing electrodes through thicker plates (e.g. 250 microns to 1,500 microns), such as the plates believed useful for constructing a liquid distribution system. It is well known that the via ink often cracks, does not adequately adhere to the sides of the holes or otherwise do not adequately seal the holes. Additionally, methods were needed to construct electrode protrusions from the surface of the plates. The present invention solves these problems.

A preferred use of the invention is to create microelectrodes. Other uses include vias to connected circuit layers in multi-level electrical substrates, vias for substrates interconnected to electrical pins and vias for connecting a module to a printed wiring board.

SUMMARY OF THE INVENTION

The present invention provides a method of forming a fluidtight electrical conduit through a high aspect ratio hole, the method comprising sintering a via ink to form the electrical conduit and to seal the hole. The method can be used to form micro-electrodes.

DEFINITIONS

Figure 1A:
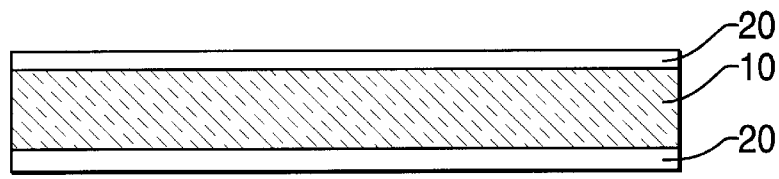
FIG. 1A–1D depict the steps of the method of the invention.

The following terms shall have the meaning set forth below:

| Term | Definition |
|---|---|
| addressable | a reaction cell or channel is "addressable" by a reservoir or another channel if liquid from the reservoir or other channel can be directed to the reaction cell or channel. |
| adjacent | "adjacent" as used in these situations: (i) a first structure in one of the plates is adjacent to a second structure in the same or another plate if the vertical projection of the first structure onto the plate of the second structure superimposes the first structure on the second or places it within about 250 μm of the second; and (ii) groupings of two or more channels are adjacent to one another if each channel is in substantially the same horizontal plane, and all but the outside two channels in the grouping are adjacent (in the sense defined in (i) above) to two neighbor channels in the grouping. Preferably, under item (i), a first structure is adjacent to a second structure if the vertical projection of the first structure onto the plate of the second structure superimposes the first structure on the second or places it within about 150 μm of the second. |
| capillary dimensions | dimensions that favor capillary flow of a liquid. Typically, channels of capillary dimensions are no wider than about 1.5 mm. Preferably channels are no wider than about 500 μm, yet more preferably no wider than about 250 μm, still more preferably no wider than about 150 μm. |
| capillary barrier | a barrier to fluid flow in a channel comprising an opening of the channel into a larger space designed to favor the formation, by liquid in the channel, of an energy minimizing liquid surface such as a meniscus at the opening. Preferably, capillary barriers include a dam that raises the vertical height of the channel immediately before the opening into the larger space. |
| connected | the channels, reservoirs and reaction cells of the invention are "connected" if there is a route allowing fluid between them, which route does not involve using a reaction cell as part of the link. |
| continuous flow channel | a channel having an overflow outlet allowing for fluid to continuously flow through the channel. |
| directly connected | reservoirs and horizontal channels are "directly connected" if they are connected and either (1) no other channel is interposed between them, or (2) only a single vertical channel is interposed between them. |
| hole diameter | because techniques for fabricating small holes often create holes that are wider at one end than the other (for instance, about 50 microns wider), the hole diameter values recited to herein refer to the narrowest diameter. |
| horizontal, vertical, EW, NS | indications of the orientation of a part of the distribution system refer to the orientation when the device is in use. The notations "EW axis" and "NS axis" are in reference to FIGS. 1, 2, 3 and 7, where an EW axis goes from right to left and is perpendicular to the long axis of the page and a NS axis is from top to bottom parallel to the long axis of the page. |
| perpendicular | channels in the distribution plate are perpendicular even if primarily located on separate horizontal planes if their vertical projections onto the same horizontal plane are perpendicular. |
| reservoir | unless a different meaning is apparent from the context, the terms "reservoir" and "fluid reservoir" include the horizontal extension channels (sometimes simply termed "extensions") directly connected to the reservoir or fluid reservoir. |
| via ink | a fluid material containing conductive material that sinters at a given temperature to form a mass that, upon cooling below the sintering temperature, is an electrically conductive solid. |

DETAILED DESCRIPTION

A. Fabrication of Electrical Conduits

The invention relates to the formation of conduits in a substrate material. These conduits are preferably fabricated in the top plate of the liquid distribution system (described above) to create electrodes. Typically each pair of such electrodes is closely spaced (e.g. 50 to 250 microns separation). The electrodes are fabricated with diameters of preferably about 25 microns to about 150 microns, more preferably about 50 microns to about 75 microns. The liquid distribution system can have 10,000 reaction cell 350 with each reaction cells 350 having 6–10 associated electrode-based pumps. Thus, a liquid distribution system can require about 200,000 to about 300,000 electrodes. Preferably, the method of the invention is used to form at least about 10,000 or more electrical conduits on a substrate, which conduits can be used as electrodes. More preferably, the method is used to form about 100,000 electrical conduits or more on a substrate. To produce such structures using mass production techniques requires forming the conduits in a parallel, rather than sequential fashion. A preferred method of forming the conduits involves forming the holes through the substrate (e.g., feedthrough plate 300) through which the conduits will protrude, filling the holes with a metallic thick film ink (i.e., a so-called "via ink") and then firing the substrate and ink fill to convert the ink into a good conductor that also seals the holes against fluid leakage. The method can also create portions of the conduits that protrude through the substrate to, for instance, on one side provide the electrodes that will protrude into the liquids in fluid channels and, on the other side provide contact points for attaching electrical controls.

For example, holes are drilled in 500 micron thick plates of borosilicate glass using an excimer laser. Holes are then filled with thick film inks, using an commercial Injection Via-fill Machine (Pacific Trinetics Model #VF-1000, San Marcos, Calif.). Select formulations of via inks have been unexpectedly discovered that sufficiently function to fill such high aspect ratio holes such that the fired ink adheres to the sides of the holes, does not crack during the firing process, and seals the holes against fluid flow. One parameter that is important to so forming sealed, conductive conduits through high aspect holes is selecting metal powder and glass powder components for the via ink that have sufficiently fine dimensions. One suitable formulation uses: 12-507 Au powder (Technic Inc., Woonsocket, R.I.), 89.3% w/w; F-92 glass (O. Hommel Co., Carnegie, Pa.), 5.7% w/w; 15% w/v ethyl cellulose N-300 (N-300, Aqualon, Wilmington, Del.) in Texanol™ (monoisobutarate ester of 2,2,4-trimethyl-1,3-pentandiol, Eastman Chemical Products, Kingsport, Tenn.), 2.4% w/w; 15% w/v Elvacite 2045™ (polyisobutyl methacrylate) in Terpineol T-318 (mixed tertiary terpene alcohols, Hercules Inc., Wilmington, Del.), 2.1% w/w; and Duomeen TDO™ (N-tallow alkyl trimethylenediamine oleates, Akzo Chemicals, Chicago, Ill.), 0.5% w/w. The gold powder from Technic, Inc. has an average particle diameter of 0.9 microns. Another suitable formulation uses: Ag Powder Q powder (Metz, South Plainfield, N.J.), 80.8% w/w; F-92 glass (O. Hommel Co. Carnegie, Pa.), 5.2% w/w; VC-1 resin (37% w/w Terpineol T-318, 55.5% W/W butyl carbitol, 7.5% w/w ethylcellulose N-300, Aqualon, Wilmington, Del.), 3.7% w/w; 15% w/v ethyl cellulose N-300 in Texanol™, 4.0% w/w; 15% W/V Elvacite 2045™ (polyisobutyl methacrylate) in Terpineol T-318, 4.1% w/w; Duomeen TDO™, 0.6% w/w; and Terpineol, 1.6% w/w. These formulations were fired at 550° C. to form high aspect ratio conductive conduits.

Note that via inks are typically admixtures of four types of components: (1) glass powders; (2) metal powders; (3) one or more organic resins that function primarily to adjust the flow characteristics of the ink; and (4) one or more solvents, which are typically organic solvents.

When the size of the glass or metal powders increases, good filling properties (lack of cracking, good sealing against liquids, good adherence to sides of hole) can still be obtained by adjusting the amount of the resin and solvent components in the via ink. Preferably, the average particle size of the powders is from about 0.3 microns to about 12 microns, more preferably from about 0.6 microns to about 8 microns. Preferably, the at least about 80% of the particles have sizes that are about ±60% of the average particle size.

The invention is particularly applicable to creating conduits in high aspect ratio holes. Such holes are defined herein as having a ratio of hole thickness to diameter of at least about 3, more preferably at least about 5, still more preferably at least about 6, yet more preferably at least about 6.5, yet still more preferably at least about 10. The substrate through which the conduits are formed are generally from about 50 microns to about 1,500 microns thick preferably from about 100 microns to about 1,000 microns thick, more preferably about 500 microns (or about 20 mils) thick. The substrate through which the conduits are formed is preferably a glass (such as Corning 7140 borosilicate glass, Corning Glass Co., Corning, N.Y.), or ceramic substrate. More preferably, it is glass.

The devices used to insert via inks into holes in a substrate typically include a metal stencil with openings corresponding to the openings in the substrate. Via ink is applied above the stencil, which rests on the substrate, and a bladder device is used to pressurize the ink to force it to fill the holes. After filling, the substrate with its via ink-filled holes is removed for further processing, as described below.

Prior to firing, much of the organic component is evaporated away by, for example, placing the ink-filled substrate in a oven (e.g. at 100° C.) for one to five minutes. Preferably, the firing is conducted at a temperature from about 450° C. to about 700° C., more preferably from about 500° C. to about 550° C. Preferably, the via ink sinters to form the conductive solid at a temperature of about 600° C. or less, preferably 550° C. or less. However, the upper end of the appropriate firing temperature range is primarily dictated by the temperature at which the substrate being treated would begin to warp. Accordingly, with some types of substrates much higher temperatures could be contemplated.

To assure that there is conductive material that protrudes above and below the glass substrate after firing, the top and bottom surface of the substrate can be coated with a sacrificial layer of thickness equaling the length of the desired protrusions. The sacrificial layers can be applied before or after the holes are formed in the substrate. If before, then the holes are formed through both the substrate and the sacrificial layers. If after, then (a) corresponding openings through the sacrificial layers can be created by creating a gas pressure difference from one side of the substrate to the other, which pressure difference blows clear the sacrificial material covering the holes or (b) such openings through at least the top sacrificial layer are created when the pressure of the ink pushes through the sacrificial layer and into the holes (leaving an innocuous amount of sacrificial layer material in the holes). An appropriate sacrificial layer burns away during the firing process. Sacrificial layers can be made coating a substrate with, for instance, 5–25 w/w % mixtures of ethyl cellulose resin (e.g., Ethyl Cellulose N-300, Aqualon, Wilmington, Del.) dissolved in Terpineol T-318™ or Texanol™, or 5–50% w/w mixtures of Elvacite 2045™ in Terpineol T-318™. After firing, the surfaces of the conduit can be enhanced by plating metals, such as nickel, silver, gold, platinum, rhodium, etc. The depositions can be performed using standard electrolytic and/or electroless plating baths and techniques.

Figure 1B:
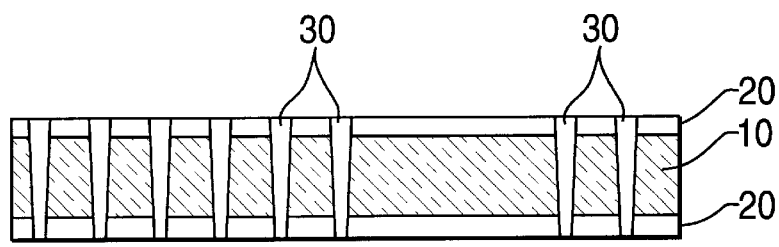
Figure 1C:
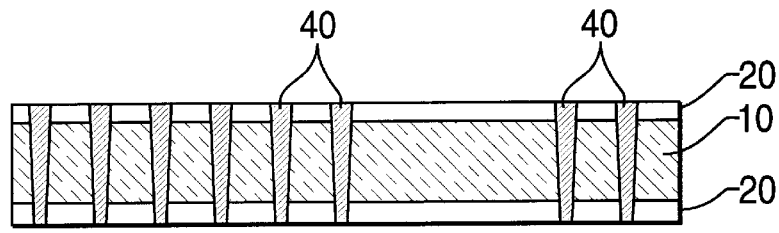
Figure 1D:
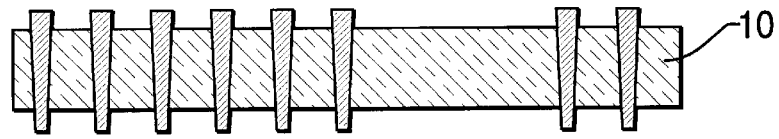

The invention can be explained by reference to FIGS. 1A through 1D. FIG. 1A shows a 20 mil thick plate 10 of substrate coated on both sides with a 1 mil layer of sacrificial material 20. Two mil diameter holes 30 were formed in the coated plate 10 (FIG. 1B). Via ink 40 was injected into the holes 30 (FIG. 1C). Finally, the plate 10 was heated to solidify the via ink and burn away the sacrificial layer (FIG. 1D).

Preferably, where a substrate that is to contain etched openings will be processed to include conduits, the etching occurs first, followed by coating with the sacrificial layer and forming the conduit holes.

In an alternate method of manufacture, for each pump, two or more metal wires, for example gold or platinum wires about 1–10 mils in diameter, are inserted into the openings in the channel walls about, e.g., 150 microns apart. The wires were sealed into the channels by means of a conventional gold or platinum via fill ink made of finely divided metal particles in a glass matrix. After applying the via fill ink about the base of the wire on the outside of the opening, the channel is heated to a temperature above the flow temperature of the via fill ink glass, providing an excellent seal between the wires and the channel.

It will be apparent that while the invention arose in the context of creating electrodes for electrokinetic pumps, the invention is applicable to any context where it is desirable to form electrical conduits through high aspect ratio holes. It is also applicable where it is desirable to form protrusions to facilitate joining the conduit to another electrical structure.

B. Liquid Distribution System

Figure 2:
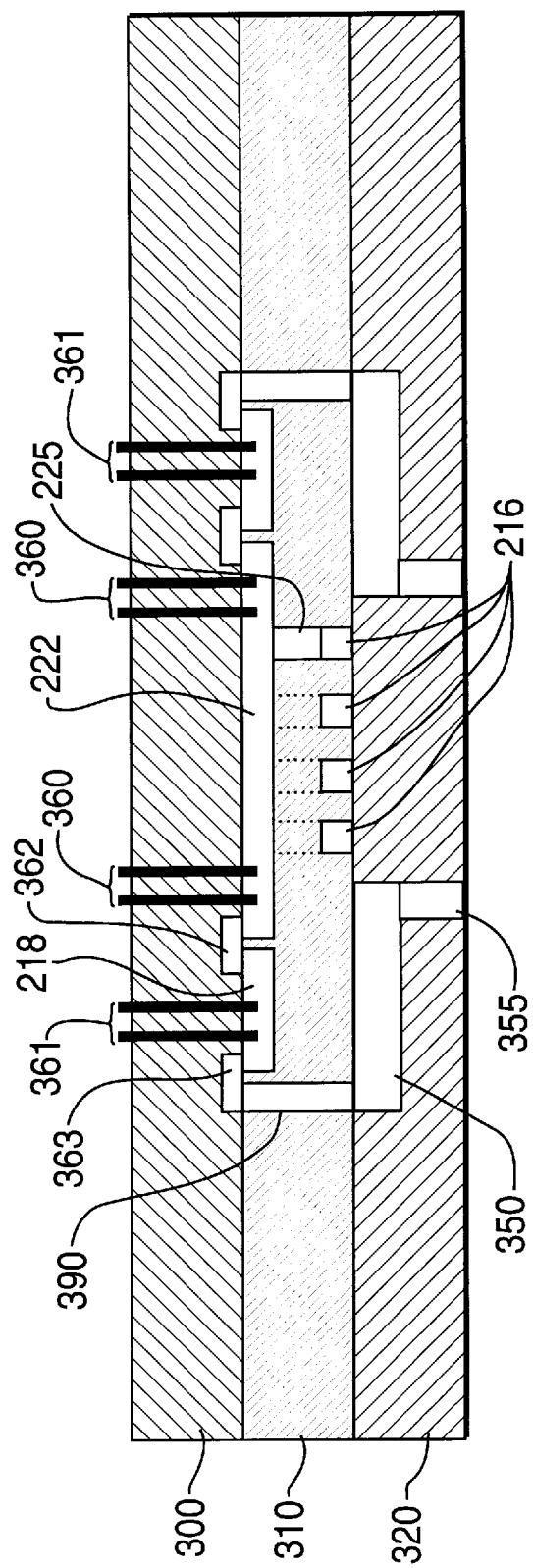
FIG. 2 displays a cut-away view of a liquid distribution system that can be used with the invention.
Figure 3:
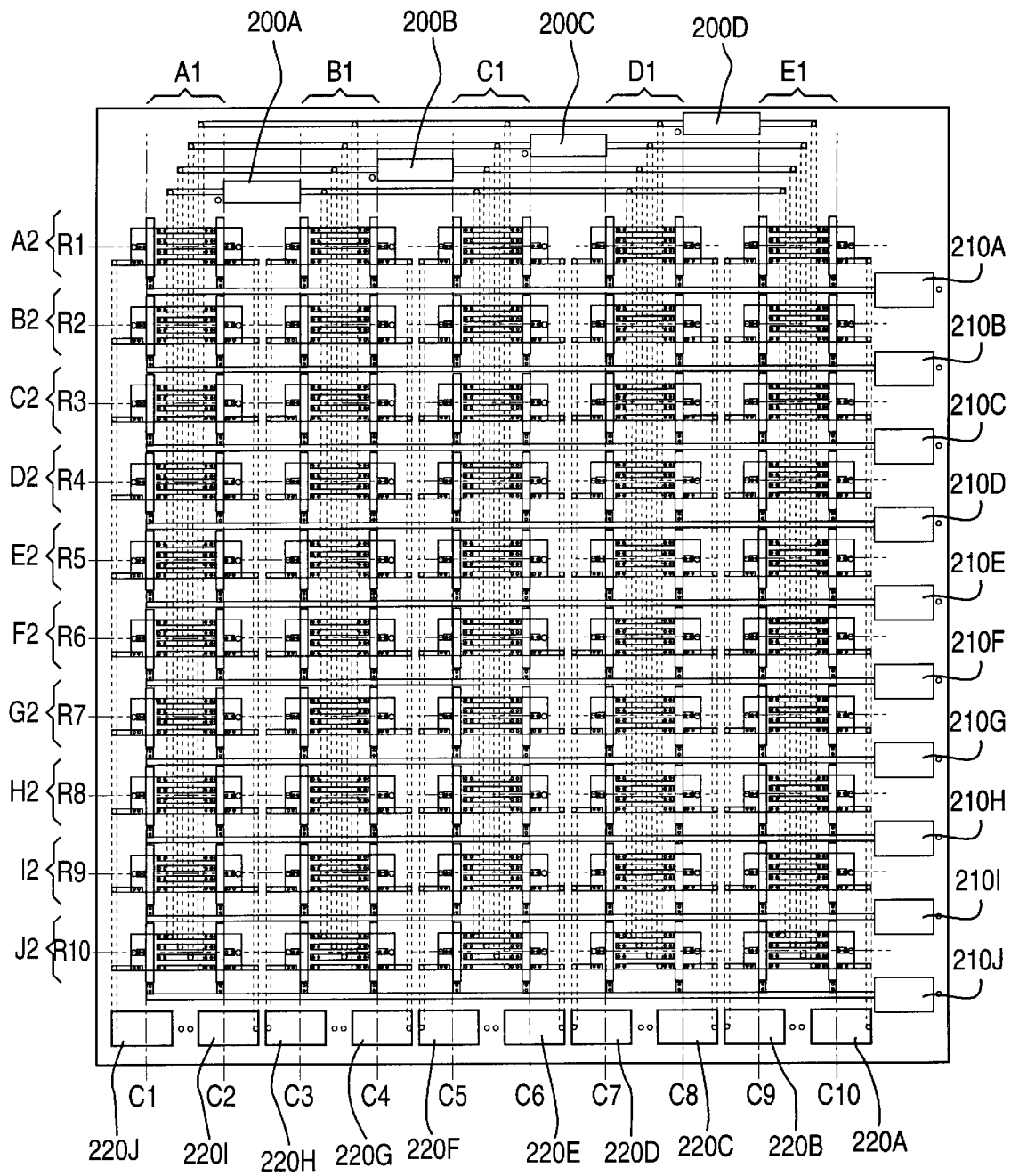
FIG. 3 displays a distribution plate of the liquid distribution system of FIG. 2.
Figure 4:
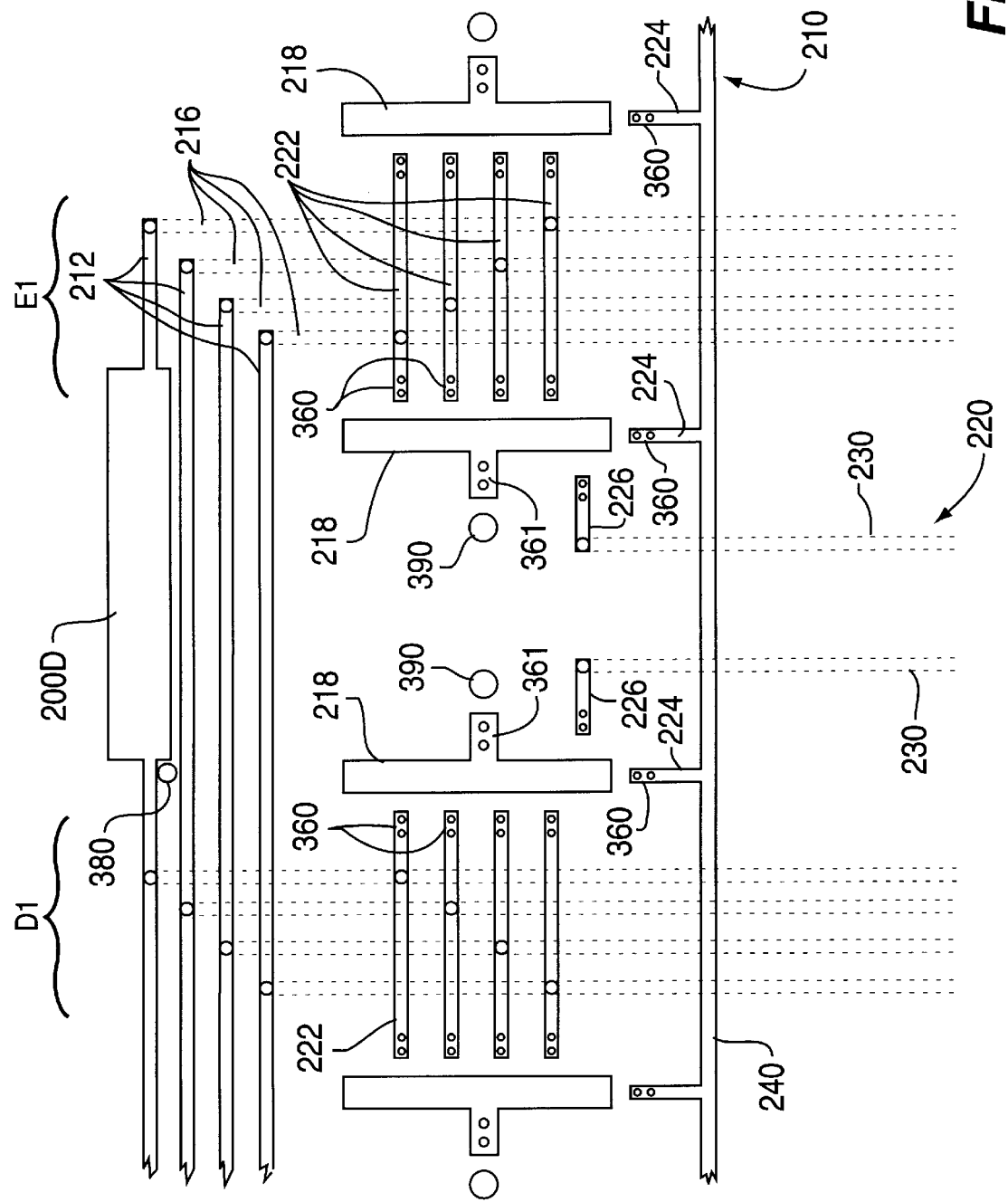
FIG. 4 displays an expanded view of a portion of the distribution plate of FIG. 3.

One version of the liquid distribution system 100 that gave rise to the invention is illustrated in FIG. 2-4. The distribution system is formed of at least three plates, a feedthrough plate 300, a distribution plate 310 and a reaction cell plate 320 (FIG. 2). The feedthrough plate 300 is bonded to the distribution plate 310. Most importantly, the feedthrough plate 300 has multiple first electrodes 360 and second electrodes 361 that can be manufactured according to the invention. The reaction cell plate 320 is typically removably fitted to the underside of the distribution plate 310, or the underside of intermediate plate 330 interposed between the distribution plate 310 and the reaction cell plate 320.

FIG. 3 shows the layout of a distribution plate 310 according to the invention. FIG. 4 shows an expanded view of a portion of a distribution plate 310 that better illustrates some of the features obscured by the scale of FIG. 4. Typically, the structures indicated in solid lines will be formed in the top layer of the distribution plate 310, while the structures indicated with dotted lines will be formed in the bottom layer of the distribution plate 310, except that in FIG. 2 the reaction cells 350 are indicated by boxes in solid lines even though these structures are located in a lower plane. Where appropriate, vertical channels connect the structures in the top of the distribution plate 310 with those in the bottom.

At the top of FIG. 3 are four first fluid reservoirs 200A, 200B, 200C and 200D, each having a defined fill level. Each of these first fluid reservoirs 200A, 200B, 200C and 200D has two first reservoir extensions 212 extending along substantially all of an EW axis (see definitions) of the distribution plate 310. The ceilings of the first reservoir extensions 212 preferably are at substantially the same elevation as the first fill level. At five staggered locations, A1, B1, C1, D1 and E1, along the EW axis of the first reservoir extensions 212 there are four first vertical channels 214 (not shown) that connect the first reservoir extensions 212 with four first horizontal feeder channel segments 216 that are formed in the bottom layer of the distribution plate 310. At each staggered location A1, B1, C1, D1 or E1, four adjacent first horizontal feeder channel segments 216, which are connected to separate first reservoir extensions 212, extend along an NS axis to ten positions, A2, B2, C2, D2, E2, F2, G2, H2, I2 and J2. Each position A2, B2, C2, D2, E2, F2, G2, 12 or J2 along the course of each such set of four adjacent horizontal feeder channel segments 216 is adjacent to a pair of reaction cells 350 (not shown). At these positions A2, B2, C2, D2, E2, F2, G2, H2, 12, or J2, the four adjacent first horizontal feeder channel segments 216 are separately connected, via separate second vertical channels 225 (not shown), to each of four perpendicular first distribution channels 222 formed in the top layer of the distribution plate 310. The ceilings of the first distribution channels 222 define a second fill level that is typically substantially the elevation of the first fill level. The fill level of a distribution channel (e.g., the second fill level) is "substantially" the fill level of the connected reservoir (e.g., the first fill level) if they are offset vertically by no more than about 10% of the depth of the channel; even if the fill levels are further offset vertically they are still substantially the same if filling the reservoir to its fill level results in filling the connected distribution channel and the retention of fluid in the connected distribution channel. The combination of a first vertical channel 214, connected to a horizontal feeder channel segment 216, in turn connected to a second vertical channel 225 makes up a first feeder channel 217 (not identified in the Figures).

If liquids are maintained at a defined first level in a first fluid reservoir 200, then substantially the same level will be maintained in the first distribution channels 222 connected to that first fluid reservoir 200 via first feeder channels 217. This equalization occurs due to the principle that two connected bodies of liquid will tend to seek the same level and, where the size of the channels allows, due to capillary flow. Liquids are maintained at a defined level in the first fluid reservoirs. In the illustrated embodiment, liquid is fed into the fluid reservoir 200 through channels in the feedthrough plate 300 and such liquid that is not needed to fill the fluid reservoirs to the defined level is drained through drains 380. First openings 381 (not shown) are formed in the bottom layer of the feedthrough plate 300 to create a liquid connection or sluice between the first fluid reservoirs 200 and the drains 380. Liquids are constantly feed into the first fluid reservoirs 200 (as well as the second fluid reservoirs 210 and third fluid reservoirs 220) typically by the use of an external pump 15 (not shown), such as the model number 205U multichannel cassette pump available from Watson-Marlow, Inc. Alternatively, a defined level can be maintained by monitoring the level of liquid in the first fluid reservoirs 200 (or second fluid reservoirs 210 or third fluid reservoirs 220) and only activating the pumps feeding liquid to a given fluid reservoir when needed to maintain the defined level.

Each set of four adjacent first distribution channels 222 are adjacent to two buffer channels 218, located to each side of the first distribution channels 222 along the EW axis. Liquid can be pumped from any first distribution channel 222 into the adjacent buffer channel 218 by activating the first pump 360 (indicated in FIG. 4 by two filled dots representing the electrodes of one type of pump) of the first distribution channel 222. This pumping creates additional pressure that moves the liquid over capillary barrier 370 (not shown) separating the first distribution channel 222 and the buffer channel 218. Between each first distribution channel 222, second distribution channel 224 or third distribution channel 226 and the adjacent buffer channel 218 and between each buffer channel 218 and its adjacent third vertical channel 390 (described below) there is such a capillary barrier 370 that inhibits liquid flow when the pumps are not activated. Second openings 362 (not shown) are formed in the bottom layer of the feedthrough plate 300 to create a liquid connection or sluice between the first distribution channels 222 and the buffer channels 218. From a buffer channel 218, liquid can be pumped using a second pump 361 (indicated in FIG. 4 by two filled dots representing the electrodes of one type of pump) to a third vertical channel 390 that connects with a reaction cell in the reaction cell plate 320. Third openings 363 (not shown) in the bottom layer of the feedthrough plate 300 or the distribution plate 310 serve to create a liquid connection or sluice between the buffer channels 218 and third vertical channels 390.

First pumps 360 or second pumps 361 can comprise electrode-based pumps. At least two types of such electrode-based pumping has been described, typically under the names "electrohydrodynamic pumping" (EHD) and "electroosmosis" (EO). EHD pumping has been described by Bart et al., "Microfabricated Electrohydrodynamic Pumps," *Sensors and Actuators,* A21–A23:193–197, 1990 and Richter et al., "A Micromachined Electrohydrodynamic Pump," *Sensors and Actuators,* A29:159–168, 1991. EO pumps have been described by Dasgupta et al., "Electroosmosis: A Reliable Fluid Propulsion System for Flow Injection Analysis," *Anal Chem.,* 66:1792–1798, 1994.

EO pumping is believed to take advantage of the principle that the surfaces of many solids, including quartz, glass and the like, become charged, negatively or positively, in the presence of ionic materials, such as salts, acids or bases. The charged surfaces will attract oppositely charged counter ions in solutions of suitable conductivity. The application of a voltage to such a solution results in a migration of the counter ions to the oppositely charged electrode, and moves the bulk of the fluid as well. The volume flow rate is proportional to the current, and the volume flow generated in the fluid is also proportional to the applied voltage. Typically, in channels of capillary dimensions, the electrodes effecting flow can be spaced further apart than in EHD pumping, since the electrodes are only involved in applying force, and not, as in EHD, in creating charges on which the force will act. EO pumping is generally perceived as a method appropriate for pumping conductive solutions.

EHD pumps have typically been viewed as suitable for moving fluids of extremely low conductivity, e.g., $10^{-14}$ to $10^{-9}$ S/m. It has now been demonstrated herein that a broad range of solvents and solutions can be pumped using appropriate solutes than facilitate pumping, using appropriate electrode spacings and geometries, or using appropriate pulsed or d.c. voltages to power the electrodes, as described further below.

The electrodes of first pumps 360 and second pumps 361 used in the liquid distribution system preferably have a diameter from about 25 microns to about 150 microns, more preferably from about 25 to about 100 microns, still more preferably from about 50 microns to about 75 microns. Preferably, the electrodes protrude from the top of a channel to a depth of from about 5% to about 95% of the depth of the channel, more preferably from about 25% to about 50% of the depth of the channel. Usually, as a result the electrodes, defined as the elements that interact with fluid, are from about 5 microns to about 95 microns in length, preferably from about 25 microns about to 50 microns.

Preferably, a pump includes an alpha electrode 364 (such as first electrode 360A or third electrode 361A) and a beta electrode 365 (such as third electrode 360B and fourth electrode 361B) that are preferably spaced from about 100 microns to about 2,500 microns apart, more preferably, from about 250 microns to about 1000 microns apart, yet more preferably, from about 150 microns to about 250 microns apart. The separation of electrodes is measured from the center points of the electrodes as they first protrude into their associated fluid channel. In a particularly preferred embodiment, a gamma electrode 366 (not shown) is spaced from about 200 microns to about 5,000 microns, more preferably from about 500 microns to about 1,500 microns, yet more preferably about 1,000 microns from the farther of the alpha electrode 364 and the beta electrode 365. In an alternative preferred embodiment, the pump has two additional electrodes comprising a gamma electrode 366 (not shown) and a delta electrode 367 (not shown) that are spaced from about 200 microns to about 5,000 microns, more preferably from about 500 microns to about 1,500 microns, yet more preferably about 1,000 microns apart. Where the electrodes are located in fluid channels that have bends, the distances are measured along a line that defines the center line of the fluid channel. In contexts where relatively low conductivity fluids are pumped, voltages are applied across the alpha electrode 364 and the beta electrode 365, while in contexts where relatively more highly conductive fluids are pumped the voltage is induced between gamma electrode 366 and one of alpha electrode 364, beta electrode 365 or delta electrode 367. The latter circumstance typically applies for solvents traditionally pumped with EO pumping, although this invention is not limited to any theory that has developed around the concepts of EHD or EO pumping. No firm rules dictate which electrode combination is appropriate for a given solvent or solution; instead an appropriate combination can be determined empirically in light of the disclosures herein.

Other features of liquid distribution systems are described in an application filed Nov. 9, 1995 entitled, "Liquid Distribution System," U.S. application Ser. No. 08/556,036, which application is a continuation-in-part of U.S. application Ser. No. 08/338,703, titled "A Partitioned Microelectronic and Fluidic Device Array for Clinical Diagnostics and Chemical Synthesis," filed Nov. 10, 1994, a continuation-in-part of U.S. application Ser. No. 08/469,238, titled "Apparatus and Methods for Controlling Fluid Flow in Microchannels," filed Jun. 6, 1995 and a continuation-in-part of U.S. application Ser. No. 08/483,331, titled "Method and System for Inhibiting Cross-Contamination in Fluids of Combinatorial Chemistry Device," filed Jun. 7, 1995. The disclosure of this Nov. 9, 1995 application entitled "Liquid Distribution System" and of all the above-recited priority filings named in the Nov. 9, 1995 application are incorporated herein by reference in their entirety.

The inventor relates to forming a combined electroosmotic and electrohydrodynamic device in a microchannel comprising: laser-drilling two closely-spaced openings and two openings spaced farther apart on each side of the two closely-spaced openings in a wall of said channel; inserting a conductive wire electrode through said openings; sealing said wire to said openings using a conductive metal via fill while comprising a mixture of glass and a conductive metal powder, and heating above the glass flow temperature; and connecting the wire pairs to a digital-pulsed power source. For instance, the EHD pump can be made as follows: Two openings are laser-drilled into the walls of a microchannel 10 wherein the diameter is about 150–400 microns. Two metal wires, for example, gold or platinum wires about 1–10 mils in diameter, are inserted into the openings in the channel walls about, e.g., 150 microns apart. The wires were sealed into the channels by means of a conventional gold or platinum via fill ink made of finely divided metal particles in a glass matrix. After applying the via fill ink about the base of the wire on the outside of the opening, the channel is heated to a temperature above the flow temperature of the via fill ink glass, providing an excellent seal between the wires and the channel.

We claim:

1. A method of forming, in a substrate, a fluid-tight electrical conduit through a high aspect ratio hole of at least about 3 the method comprising fusing a via ink to form the electrical conduit and to seal the hole.

2. The method of claim 1, wherein the via ink comprises glass and metal powders, wherein average particle size of the glass and metal powders in the via ink is from about 0.3 microns to about 12 microns.

3. The method of claim 2, wherein the average particle size of the glass and metal powders in the via ink is from about 0.6 microns to about 8 microns.

4. The method of claim 2, wherein at least about 80% of the glass and metal particles have sizes that are about ±60% of the average particle size.

5. The method of claim 1, comprising fusing the via ink to form a conductive solid by sintering at a temperature of no more than about 550° C.

6. The method of claim 1, wherein the substrate is glass.

7. The method of claim 1, wherein the aspect ratio of the holes is at least about 6.

8. The method of claim 1, wherein the aspect ratio of the holes is at least about 10.

9. The method of claim 1, further comprising, coating the substrate in which the hole is formed with a sacrificial layer prior to filling the holes with via ink.

10. The method of claim 9, wherein the coating with the sacrificial layer occurs before forming the holes.

11. The method of claim 9, further comprising, after coating the substrate with the sacrificial layer, treating the substrate with an etching process to create channels, reservoirs or reaction cells.

12. The method of claim 9, wherein after the heating step the via ink forms protrusions from the substrate.

13. The method of claim 1, wherein the holes have diameters from about 25 to about 150 microns and are at least about 50 microns deep.

14. The method of claim 13, wherein the holes have diameters from about 25 to about 100 microns.

15. The method of claim 13, wherein the holes have diameters from about 50 to about 75 microns.

16. The method of claim 13, wherein the holes are from about 50 microns to about 1,500 microns deep.

17. The method of claim 13, wherein the holes are from about 100 microns to about 1,000 microns deep.

18. The method of claim 13, wherein the holes are about 500 microns deep.

19. The method of claim 1, wherein about 10,000 electrical conduits are concurrently formed on the substrate.

20. The method of claim 19, wherein about 100,000 electrical conduits are concurrently formed on the substrate.

21. The method of claim 1, further comprising plating metal onto at least one end of the conduit.

22. The method of claim 21, wherein the metal is nickel, silver, gold, platinum or rhodium.

* * * * *